June 7, 1966 R. M. WARNER, JR 3,255,364

THREE FIELD EFFECT TRANSISTOR GYRATOR

Filed July 10, 1963 3 Sheets-Sheet 1

INVENTOR.
Raymond M. Warner Jr.
BY
Mueller & Aichele
ATTY'S.

June 7, 1966 R. M. WARNER, JR 3,255,364

THREE FIELD EFFECT TRANSISTOR GYRATOR

Filed July 10, 1963 3 Sheets-Sheet 2

INVENTOR.
Raymond M. Warner Jr.
BY
[signature]
ATTY'S.

INVENTOR.
Raymond M. Warner Jr.
BY Mueller & Aichele
ATTY'S.

United States Patent Office 3,255,364
Patented June 7, 1966

3,255,364

THREE FIELD EFFECT TRANSISTOR GYRATOR

Raymond M. Warner, Jr., Scottsdale, Ariz., assignor to Motorola, Inc., Chicago, Ill., a corporation of Illinois Filed July 10, 1963, Ser. No. 294,096
5 Claims. (Cl. 307—88.5)

This invention relates to the semiconductor art and particularly to a semiconductor gyrator suitable for use with a capacitor as a load, the combination to serve as an inductive component in integrated circuit applications.

A problem for the integrated circuit designer is posed by the fact that a generally satisfactory inductance has not been available that meets the technological and size requirements for integration into a circuit on a tiny wafer of silicon, for example. Capacitance, however, may be converted to inductance by impedance inversion, so that a capacitive component in combination with the impedance inverter may substitute for an inductor. Such substitution is especially useful because the size of the inductance is proportional to capacitor size which may easily be made to a desired value by simple changes in its physical dimensions. A gyrator is an impedance inverter and a gyrator of simple design and minute size which could be fabricated on a silicon wafer by methods compatible with integrated circuit requirements would be most useful and desirable for achieving satisfactory inductances.

The object, then, of this invention is to provide a gyrator of small size which may be fabricated as an integrated circuit component.

A feature of this invention is a gyrator composed of field effect transistors and simple resistive and capacitive components all of which may be readily fabricated using well-known integrated circuit technology.

A gyrator is an impedance inverter. The changing of capacitance to inductance by impedance inversion using a gyrator which is readily fabricated as a portion of an integrated circuit provides a way of achieving substantial inductive values in such a circuit in a simple but indirect manner.

The drawings and the following text explain the invention in detail.

Figure 1:
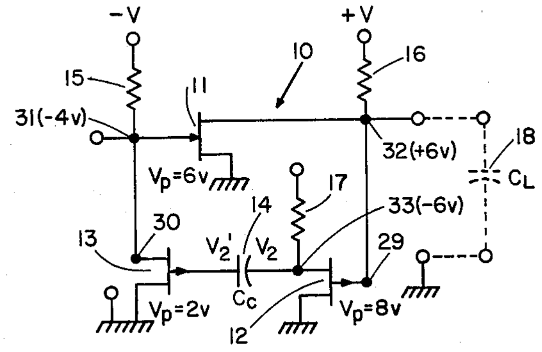
FIG. 1 is the schematic drawing of the gyrator of this invention.

This invention is a gyrator circuit, the preferred embodiment of which is shown in FIG. 1. It is made up of three field effect transistors 11, 12 and 13, a coupling capacitor 14 with a value $C_C$ and three resistors 15, 16, and 17. Obviously, the phrase field effect transistor will sometimes be abbreviated to FET in the following description.

The gyrator 10 may be made by wiring together separate components as well as by forming interconnected integrated circuit components on a substrate of silicon, for example. The techniques for making FET's, capacitors and resistors as integrated circuit components are well known. The load capacitor 18 with a value $C_L$ (dashed lines) represents the capacitance to be changed to inductance by the action of the gyrator.

The gyrator 10 has only five components between its terminals; i.e., the three field effect transistors 11, 12 and 13, the coupling capacitor 14, and the bias resistor 17. Where the gyrator is fabricated as an integrated circuit, the resistors 15 and 16 may be external to the gyrator package, if desired. The capacitor 14 serves as a coupling element between the drain of FET 12 and the gate of FET 11. Other coupling networks may be used if desired, but a single capacitor will suffice.

The basic mode of operation of the gyrator is as follows. The field effect transistor 11 acts as a voltage-to-current transducer and also provides phase inversion for signals going from left to right, i.e., from the input to the output of the gyrator. In the other path, from output to input, FET 12 acts as a voltage amplifier and phase inverter and FET 13 acts as a voltage-to-current transducer and phase inverter. With the two FET's 12 and 13 in cascade as in FIG. 1, there is no net phase inversion for signals going from right to left. Thus, the transfer admittance measured at the input terminals of the gyrator can be made the negative of the transfer admittance measured at the output terminals.

It has been said that a gyrator has the property that it "gyrates" a current into a voltage, and vice versa. The FET's 11, 12 and 13 provide this voltage-current translation, and have some additional properties which make the circuit 10 approach the "ideal" gyrator. The input and output self-impedances of a gyrator should ideally be infinite. The self-impedances of the gyrator of FIG. 1 are essentially those of the reverse-biased junctions of FET's 11, 12 and 13 and therefore can be very high. The field effect transistor has the property of high input impedance as well as high output impedance. This makes it possible by the use of field effect transistors to provide a nearly ideal gyrator, where an input terminal and an output terminal must be common on both sides of the gyrator and still realize very high self-impedances (zero self-admittances). By mathematical analysis which parallels the preceding discussion, it can be shown that the gyrator 10 will be nearly ideal if $|-g_{m11}|=R_{17}g_{m12}g_{m13}$ where the $g_m$ values are the transconductances of FET's 11, 12 and 13.

The choice of bias voltages and parameters for the circuit of FIG. 1 is governed by the following considerations. The voltage at 31 should operate FET 13 beyond pinch-off but must not cut off FET 11. The voltage at 32 should operate FET 11 beyond pinch-off but not cut off FET 12. At 33 the voltage is not critical because FET 12 may be operated either above or below pinch-off and the capacitor 14 blocks voltage from transistor 13. It is desirable for FET 12 to be a low gain device so that the signal voltage applied to the gate of FET 13 is small enough to allow the latter transistor to operate with its gate floating. Alternatively, the gate of FET 13 may receive a fixed bias, but a bias terminal must be added in this case.

In order to achieve the operating conditions just described, the transistors are selected and arranged such that the pinch-off voltage of FET 13 is the lowest of the three, that of FET 12 is the highest, and that of FET 11 is intermediate. A typical set of pinch-off voltages ($V_p$) and bias voltages have been shown in FIG. 1 for illustration only.

To understand the action of the gyrator it will be useful to review some properties of a capacitor and an inductor with sinusoidal drive.

Figure 2:
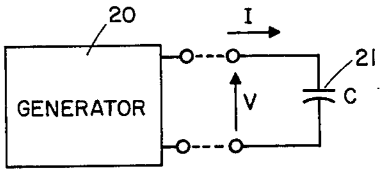
FIG. 2 shows the arbitrarily assigned positive sense or direction of current and voltage to a capacitor connected to a voltage generator.

No current flows in a statically charged capacitor. Current flows only when applied voltage is increasing or decreasing. An increasing voltage produces a positive current, using the sign convention shown in FIG. 2 in which a voltage generator 20 is driving a capacitor 21.

Figure 3:
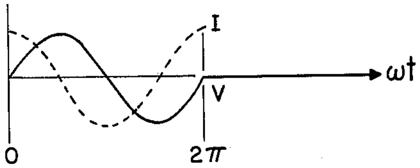
FIG. 3 is a graph of current and voltage versus time for a capacitor sinusoidally driven by a generator as in FIG. 2.

FIG. 3 is a plot of current and voltage versus time to show graphically that at any value of $\omega_t$ (Angular frequency×time) the current leads the voltage by $\pi/2$ radians.

Figure 4:
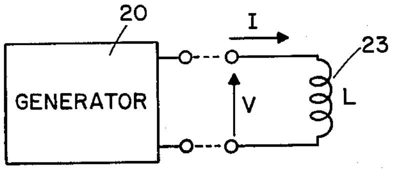
FIG. 4 represents an inductor driven by a voltage generator.
Figure 5:
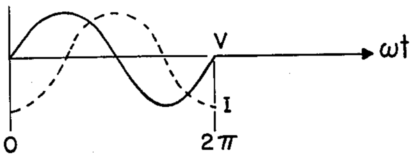
FIG. 5 is a graph of current and voltage versus time for inductor sinusoidally driven by a generator as in FIG. 4.

Now let the same generator 20 be used to drive an inductor 23 (FIG. 4). When voltage is at a maximum, current begins to flow in the corresponding direction. When voltage has returned to zero, current is at a maximum and stored energy in the form of magnetic flux is at a maximum. As the flux lines collapse they maintain current in the same direction for a quarter cycle. Current lags the voltage by $\pi/2$, as can be appreciated by plotting current and voltage versus time once again (FIG. 5).

Figure 6:
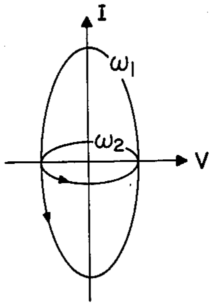
FIG. 6 is a graph of current versus voltage for an inductor at two different angular frequencies $\omega_1$ and $\omega_2$, where $\omega_2$ is higher than $\omega_1$.

An alternative method for showing this phase relationship is to plot current versus voltage as in FIG. 6. Such a diagram is also able to show in a convenient manner the effect of changing frequency. For the purpose of this diagram let us consider that the generator 20 is a pure voltage source and that its voltage is independent of frequency. Each ellipse with the specified sense, as indicated by an arrowhead in FIG. 6, clearly shows current lagging voltage by a quarter cycle. The voltage axes of the ellipses are equivalent because we have specified constant applied voltage. The current excursions at the higher frequency, $\omega_2$, are less than at the lower, $\omega_1$, because of the combination of effects that we usually sum up by saying that the impedance of an inductor increases with frequency.

Figure 7:
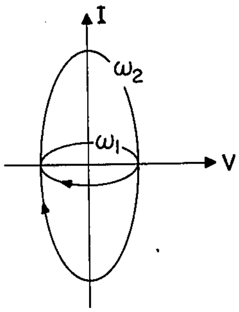
FIG. 7 is a graph of current versus voltage for a capacitor at two different angular frequencies $\omega_1$ and $\omega_2$.

Now let a capacitor be substituted for the inductor. The appropriate I–V diagram is shown in FIG. 7. This time, of course, the sense of the ellipse is clockwise rather than counterclockwise. Also the current excursion increases with frequency. This is because a larger current is required to charge the capacitor to the same voltage as before in the shorter period.

Figure 8:
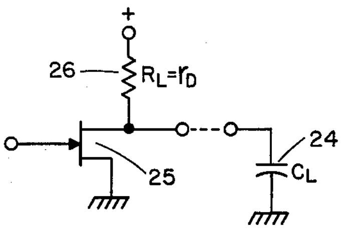
FIG. 8 represents a capacitor driven by a field effect transistor.
Figure 9:
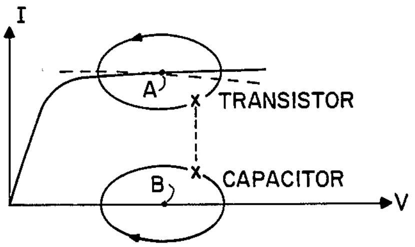
FIG. 9 is a graph of current versus voltage for the capacitor and the field effect transistor of FIG. 8 with the transistor biased at a quiescent point A.

Now let a capacitor 24 of value $C_L$ be driven by a high impedance source, such as an FET 25 with a value of load resistance $R_L$ (resistor 26) matching the output impedance, $r_D$, of the transistor as shown in FIG. 8. The large resistance $R_L$ and the bias voltage (−v.) can be regarded as a current source feeding the FET 25 and capacitor 24. In the quiescent state, the FET 25 carries all the current. But when a signal is applied to the FET 25, varying its output current, then the constant current from resistor 26 is shared by the FET 25 and capacitor 24. It is considered that at the frequency in question, the impedance of capacitor 24 is low compared to the resistance value $R_L$ of resistor 26. Also, voltage changes across capacitor 24 have a negligible effect on the current through resistor 26. This situation is shown in the I–V plane at the frequency $\omega_1$ in FIG. 9. The transistor is biased at the quiescent point A. The capacitor has an equal voltage on it and sits at point B. It should be emphasized that I and V stand for D.C. current and voltage. Therefore the ellipses are shown displaced from the origin as they are in reality in this high-impedance-generator case. It will be noticed that the senses are opposite in the two ellipses. This is because the same sign convention has been used for the FET as for the capacitor, namely, that an inward current is positive. The coordination of the two paths is indicated through the points marked X. Thus the current sum is approximately a constant at all times and the voltage on the two will fluctuate in a correlated manner.

Figure 10:
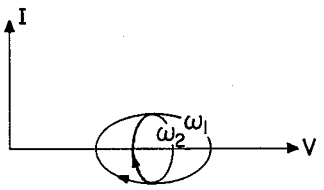
FIG. 10 is a graph of the capacitor alone of FIG. 8 for two angular frequencies $\omega_1$ and $\omega_2$.

The lower ellipse alone, which applied to the capacitor 24, is shown in FIG. 10. Under the stated conditions of a constant current source, raising frequency will diminish the voltage swing because the capacitor will charge to a lesser degree in the shorter period.

Figure 11:
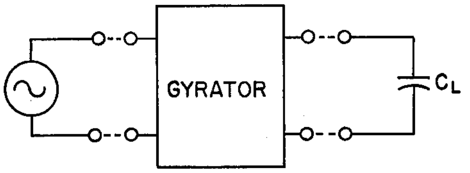
FIG. 11 shows a capacitor connected to the output of a gyrator and driven by an alternating voltage source.

In FIG. 11, a capacitor 18 of value $C_L$ is connected to the gyrator 10 of FIG. 1 and the gyrator is driven by means of an alternating voltage source 28. In the I–V plane, the phase and frequency dependence shown qualitatively in FIG. 10 will now apply to capacitor 18. As compared to FIG. 8, the added presence in FIG. 11 of the input terminal 29 of FET 12 and the output terminal 30 of FET 13 connected to the output and input terminals, respectively, of the gyrator will not in any way affect the relationship discussed previously with reference to FIG. 8 because the impedances at the terminals just referred to are very high.

Figure 12:
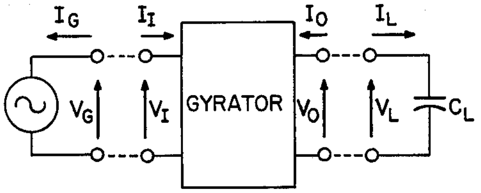
FIG. 12 is to show the positive sense of the currents $I_G$, $I_I$, $I_O$ and $I_L$ and the voltages $V_G$, $V_I$, $V_O$ and $V_L$ of the generator, gyrator and capacitor of FIG. 11.

FIG. 12 defines the terminal currents and voltages. Once again the inward direction is taken as positive in every case. The subscripts I and O refer to the input and output terminals of the gyrator; G and L refer to the generator and load, respectively.

Now it will be shown that a capacitor load indeed presents the appearance of an inductor when viewed through the gyrator. Using the method of plotting in the I–V plane, we will start with the relationship existing at the capacitor 18 and establish what relationship it leads to at the input terminals of the gyrator 10. Due consideration will be given to the D.C. components of I and V (that is, the ellipses will be plotted in the proper quadrant) in order to make this qualitative argument as explicit as possible.

Figure 13:
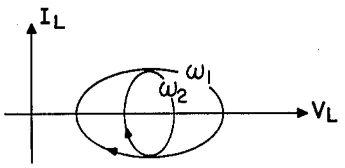
FIG. 13 is a graph of $I_L$ versus $V_L$ for the capacitor at $\omega_1$ and $\omega_2$.
Figure 14:
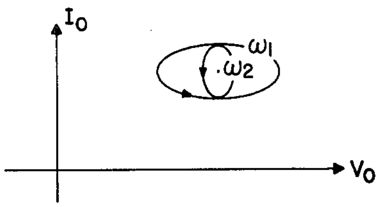
FIG. 14 is a graph of $I_O$ versus $V_O$ for the gyrator output at $\omega_1$ and $\omega_2$.
Figure 15:
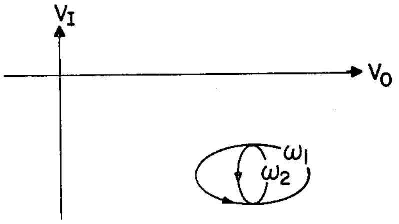
FIG. 15 shows a graph of $V_I$ versus $V_O$ for the gyrator.
Figure 16:
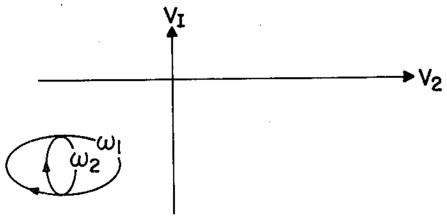
FIG. 16 is a graph of $V_I$ versus $V_2$.
Figure 17:
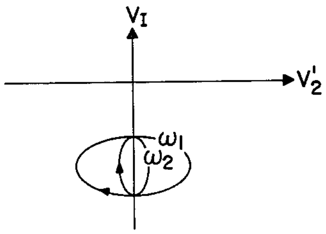
FIG. 17 is a graph $V_I$ versus $V_2'$.
Figure 18:
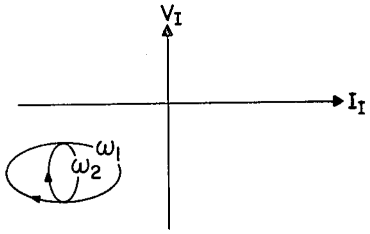
FIG. 18 is a graph of $V_I$ versus $I_I$.

First consider $I_L$ versus $V_L = V_O$ as plotted in FIG. 13. This is identical to the relationship shown in FIG. 10. Now convert to $I_O$ versus $V_O = V_L$ (FIG. 14), noting that the sense of traversing the ellipse must be changed as explained in connection with FIG. 9. Next convert to a V—V diagram, specifically $V_I$ versus $V_O$ plotted in FIG. 15. Here it is important to realize that an increasing voltage on the gate of transistor 11 leads to an increasing current into the drain. That is, input voltage and output current in the FET, as defined, are in phase. In FIG. 15 there is merely a change of quadrants as compared to FIG. 14 because the signs of the D.C. biases are opposite. Now consider the plot $V_I$ versus $V_2$ in FIG. 16. $V_2$ is the output voltage from transistor 12. In converting $V_O$ to $V_2$ there is a phase change as well as a change of sign of bias point, as is evident from comparison of FIGS. 15 and 16. Since a large value coupling capacitor 14 is assumed, its impedance at all frequencies of interest will be considered small and therefore $V_2' = V_2$ (see FIG. 1). Thus $V_I$ versus $V_2'$ as plotted in FIG. 17 involves just a translation to account for the fact that the gate of transistor 13 is permitted to float at ground potential. Next convert from $V_2'$ to $I_I$ giving the graph of FIG. 18. Once again there is no phase change. It will now be apparent that the desired relationship between input current and voltage to the gyrator has been obtained. The positive I and V axes may now be interchanged as in FIG. 19 in order to display $I_I$ versus $V_I$ as before.

Figure 19:
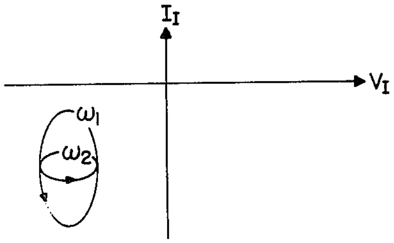
FIG. 19 is the graph of 18 with the $I_I$ and $V_I$ axes interchanged.

From a comparison of FIG. 19 with FIG. 6 it is clear that the phase relationship and frequency dependence are those associated with an inductor. At this point it can of course be stated that the D.C. components can be subtracted and are unimportant.

In summary with reference to FIG. 12, the following has been done; first, by driving the capacitive load 18 with a high impedance circuit 10, the load has been made to exhibit a characteristic frequency-dependent voltage, $V_L$, placing the higher-frequency ellipse inside that for the lower frequency. Through a voltage-to-current transducer (the return path through the gyrator) $V_L$ has been converted to a frequency dependent current, $I_I$, which is characteristic of an inductor driven by a low-impedance generator. Note that the higher frequency ellipse is still inside the lower frequency ellipse.

The second feature that has been accomplished is the desired phase relationship. First looking at the forward direction of transmission through the gyrator (to the right in FIG. 12), from $V_I$ to $I_O$ the phase change is zero. (The presence of the capacitor 18 leads to the inevitable $\pi/2$ relationship between $V_O$ and $I_O$.) Now proceed in the reverse direction. From $V_O$ to $V_2$ (see FIG. 1) there is a shift of $\pi$ radians; from $V_2$ to $I_I$ there is zero shift. It is clear then that the overall return shift is $\pi$ radians while the forward shift is zero.

Thus the gyrator's function can be considered twofold. It converts the frequency dependence of reactance and the phase associated with the load capacitor into those associated with an inductor. The reactance now rises linearly with frequency within the operational frequency range of the circuit, and the current lags the voltage by $\pi/2$. This behavior constitutes impedance inversion, and thus the system as a component may be considered as an inductor.

What is claimed is:

1. A gyrator, including in combination, first, second and third field effect transistors each having an output electrode and a gate electrode, input circuit means connected to said gate electrode of said first transistor and to said output electrode of said second transistor, output circuit means connected to said output electrode of said first transistor and to said gate electrode of said third transistor, circuit means connecting said gate electrode of said second transistor to said output electrode of said third transistor, first bias supply means coupled to said first transistor for biasing the same beyond the pinch-off point of its drain characteristic without cutting off said third transistor, second bias supply means coupled to said second transistor for biasing the same beyond the pinch-off point of its drain characteristic without cutting off said first transistor, and third bias supply means coupled to said third transistor for providing a bias potential for the same.

2. A gyrator, including in combination, first, second and third field effect transistors each having an output electrode and a gate electrode, said second transistor having a lower pinch-off voltage value than said first transistor and said third transistor having a higher pinch-off voltage value than said first transistor, input circuit means connected to said gate electrode of said first transistor and to said output electrode of said second transistor, output circuit means connected to said output electrode of said first transistor and to said gate electrode of said third transistor, circuit means connecting said gate electrode of said second transistor to said output electrode of said third transistor, first bias supply means coupled to said first transistor for biasing the same beyond the pinch-off point of its drain characteristic without cutting off said third transistor, second bias supply means coupled to said second transistor for biasing the same beyond the pinch-off point of its drain characteristic without cutting off said first transistor, and third bias supply means coupled to said third transistor for providing a bias potential for the same.

3. A gyrator, including in combination first, second and third field effect transistors each having a source, a drain and a gate, input means connected to the gate of said first transistor and to the drain of said second transistor, output means connected to the drain of said first transistor and to the gate of said third transistor, means coupling the gate of said second transistor to the drain of said third transistor, means for biasing said first transistor beyond the pinch-off point of its drain characteristic without cutting off said third transistor, means for biasing said second transistor beyond the pinch-off point of its drain characteristic without cutting off said first transistor, and means for applying bias to said third transistor.

4. A gyrator, including in combination first, second and third field effect transistors each having a source, a drain and a gate, said second transistor having a lower pinch-off voltage value than said first transistor and said third transistor having a higher pinch-off voltage value than said first transistor, input means connected to the gate of said first transistor and to the drain of said second transistor, output means connected to the drain of said first transistor and to the gate of said third transistor, means coupling the gate of said second transistor to the drain of said third transistor, means for biasing said first transistor beyond the pinch-off point of its drain characteristic without cutting off said third transistor, means for biasing said second transistor beyond the pinch-off point of its drain characteristic without cutting off said first transistor, and means for applying bias to said third transistor.

5. The gyrator of claim 4 in which said coupling means comprises a capacitor which allows said first transistor to operate with the gate thereof floating.

References Cited by the Examiner

UNITED STATES PATENTS

| | | | |
|---|---|---|---|
| 3,001,157 | 9/1961 | Sipress et al. | 333—24.1 |
| 3,168,649 | 2/1965 | Mayers | 307—88.5 |

OTHER REFERENCES

Electronics: "Theory and Use of Field-Effect Tetrodes," by H. A. Stone; vol. 32, No. 20, May 15, 1959; pages 66–68 relied on.

Electronics: "How to Get Maximum Input Impedance With Field-Effect Transistors," by T. R. Bignell, March 8, 1963; page 44 relied on.

JOHN W. HUCKERT, *Primary Examiner.*

DAVID J. GALVIN, J. D. CRAIG, *Assistant Examiners.*